United States Patent
Yang et al.

(10) Patent No.: US 6,815,287 B2
(45) Date of Patent: Nov. 9, 2004

(54) LOCALIZED ARRAY THRESHOLD VOLTAGE IMPLANT TO ENHANCE CHARGE STORAGE WITHIN DRAM MEMORY CELLS

(75) Inventors: Rongsheng Yang, Meridian, ID (US); Howard Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 10/437,494

(22) Filed: May 14, 2003

(65) Prior Publication Data

US 2003/0201471 A1 Oct. 30, 2003

Related U.S. Application Data

(62) Division of application No. 10/234,576, filed on Aug. 30, 2002, which is a division of application No. 09/945,252, filed on Aug. 30, 2001.

(51) Int. Cl.$^7$ ........................................... H01L 21/8242
(52) U.S. Cl. ....................... 438/241; 438/286; 438/451
(58) Field of Search ............................... 438/241, 286, 438/451, 289, 298, 450

(56) References Cited

U.S. PATENT DOCUMENTS

| | | | |
|---|---|---|---|
| 4,728,619 A | * | 3/1988 | Pfiester et al. ............... 438/451 |
| 5,405,788 A | * | 4/1995 | Manning et al. ............. 438/241 |
| 5,434,099 A | * | 7/1995 | Hsue ........................... 438/451 |
| 5,439,835 A | * | 8/1995 | Gonzalez ..................... 438/241 |
| 5,459,345 A | | 10/1995 | Okudaira et al. |
| 5,541,870 A | | 7/1996 | Mihara et al. |
| 5,554,557 A | | 9/1996 | Koh |
| 5,650,349 A | | 7/1997 | Prall et al. |
| 5,946,584 A | | 8/1999 | Wu et al. |
| 6,005,801 A | | 12/1999 | Wu et al. |
| 6,011,307 A | | 1/2000 | Jiang et al. |
| 6,093,661 A | | 7/2000 | Trivedi et al. |
| 6,124,173 A | | 9/2000 | Gonzalez et al. |
| 6,162,693 A | | 12/2000 | Wang et al. |

OTHER PUBLICATIONS

Y.V. Ponomarev, P.A. Stolk; A.C.M.C. van Brandenburg, R. Roes, A. H. Montree, J. Schmitz, P.H. Woertee, Channel Profile Engineering of 0.1 $\mu$m–Si MOSFETs by Through–the–Gate Implantation

* cited by examiner

Primary Examiner—David Nelms
Assistant Examiner—Dao H. Nguyen
(74) Attorney, Agent, or Firm—Knobbe, Martens, Olson & Bear, LLP

(57) ABSTRACT

A DRAM device having improved charge storage capabilities and methods for providing the same. The device includes an array portion having a plurality of memory cells extending from a semiconductor substrate. Each cell includes a storage element for storing a quantity of charge indicative of the state of the memory cell and a valve element that inhibits the quantity of charge from changing during quiescent periods. The storage elements are disposed adjacent a plurality of storage regions of the substrate and the valve elements are disposed adjacent a plurality of valve regions of the substrate. A plurality of dopant atoms are selectively implanted into the array portion so as to increase a threshold voltage which is required to develop a conducting channel through the valve region. The dopant atoms are disposed mainly throughout the valve regions of the substrate and are substantially absent from the storage regions. Consequently, the increased threshold voltage results in a reduced subthreshold leakage current flowing through the valve region. Furthermore, the reduced dopant concentration within the storage regions results in a reduced junction leakage current flowing through the substrate that bypasses the valve region.

17 Claims, 8 Drawing Sheets

LOCALIZED ARRAY THRESHOLD VOLTAGE IMPLANT TO ENHANCE CHARGE STORAGE WITHIN DRAM MEMORY CELLS

BACKGROUND OF THE INVENTION

This is a divisional application of U.S. patent application Ser. No. 10/234,576, filed Aug. 30, 2002 which was a divisional application of U.S. patent application Ser. No. 09/945,252 which was filed Aug. 30, 2001. The entire disclosure of the prior application, from which a copy of the oath or declaration is supplied is considered as being part of the disclosure of the accompanying application and is hereby incorporated by reference therein.

1. Field of the Invention

The present invention relates to semiconductor devices and, in particular, relates to DRAM devices having improved charge storage capabilities.

2. Description of the Related Art

The Dynamic Random Access Memory (DRAM) device is an important component of electronic systems requiring digital storage capabilities, such as digital computers, personal data assistants (PDA), and the like. The typical DRAM provides an array of memory cells disposed in a high density configuration. For example, a single DRAM device having a minimum feature dimension of 0.15 micron can include an array of millions of directly addressable memory cells that are each capable of storing a single bit of digital data.

FIG. 1 schematically illustrates a typical memory cell 20 comprising a single capacitor 21 and a field effect transistor (FET) 22. The capacitor 21 stores a quantity of charge which is indicative of the state of the memory cell 20. The FET 22 acts as a switch that provides a conducting path to the capacitor 21 when the cell 20 is being addressed. The FET 22 also isolates the capacitor 21 when the memory cell 20 is in a quiescent state, i.e., not being addressed, so that the capacitor 20 can store charge for extended periods of time.

As shown in FIG. 1, the FET 22 is formed within a substrate 23 and the capacitor 21 formed adjacent the substrate 23 in an ILD layer 31. The substrate 23 includes first and second doped regions 24, 25 and a channel 26 extending therebetween. For example, the first doped 24 region can be configured to be a source input of the FET 22 and the second doped region 25 can be configured to be a drain input of the FET 22. The FET 22 further comprises a gate electrode 27 disposed over the channel 26 which extends between the source 24 and drain 25 of the FET 22 and is insulated from the substrate 23 by a thin insulating layer 28. Furthermore, the capacitor 21 comprises first and second plates 29, 30 separated by an insulating layer 31, wherein the first plate 29 is coupled to the source of the FET 22 and the second plate 30 is coupled to a fixed reference voltage.

As is well known in the art, when the voltage applied at the gate 27 is greater than a threshold value, the channel 26 becomes a conducting path that allows charge to readily flow between the source 24 and drain 25. Thus, in response to a write signal arriving at the drain via a digit line 32, charge is able to flow through the channel 26 to the first plate 29 of the capacitor 21, thereby providing the capacitor 21 with a quantity of charge which is indicative of the input write signal. Likewise, during a read cycle, an output read signal can be developed at the drain 25 of the FET 22 which is indicative of the charge stored in the capacitor 21. Furthermore, during quiescent periods when the memory cell 20 is not being addressed, the gate voltage is reduced below the threshold value so as to inhibit conduction across the channel 26 and, thereby, help preserve the charge of the capacitor 21.

A common problem with memory cells of the prior art is that the capacitor is unable to store charge indefinitely. For example, even if the gate voltage is maintained below the threshold value, a subthreshold leakage current usually flows through the channel 26 which discharges the capacitor during the quiescent period. To accommodate such discharging, typical DRAM devices also include refresh circuitry which periodically monitors the state of each memory cell and repeatedly recharges individual capacitors having a detected residual charge. However, because the DRAM is inaccessible during the refresh cycle, such refreshing reduces the rate at which data can be read from or written to the device. Thus, there is a need to reduce the subthreshold leakage currents so as to extend the time between refresh cycles and, therefore increase the throughput of the device.

One method that can be used to reduce subthreshold leakage currents involves disposing complementary dopant atoms in the channel region of each FET of the memory array. For example, if the source and drain of the FET include pentavalent dopant atoms, such as Phosphorous, the complementary dopant atoms would comprise trivalent dopant atoms, such as Boron. The presence of the complementary dopant atoms within each channel region increases the corresponding threshold gate voltage and, as a result, also increases the resistance of the channel region during quiescent periods.

To ensure that each FET of the memory array is configured with substantially uniform operating characteristics, i.e. uniform gate threshold values, it is important for each channel region to be doped in a substantially identical manner. For example, a first channel region having complementary dopant atoms disposed throughout the first channel region will provide a substantially different gate threshold value than that of a second channel region having a reduced concentration of complementary dopant atoms near its edges. Thus, because of the difficulty of precisely embedding complementary dopant atoms only within the relatively narrow confines of the channel of the typical memory array using conventional masking techniques, the industry has adopted the practice of doping the complementary atoms using a blanket implant process. In other words, no attempt is made to prevent some of the complementary atoms from becoming implanted within regions of the substrate immediately adjacent the channel regions.

The blanket implant process of the prior art comprises exposing a relatively large portion of the substrate corresponding to the entire memory array to a source of energetic complimentary dopant atoms. As a result, complementary dopant atoms 33 are embedded not only within the channel 26 but also in the doped source and drain regions 24, 25 that surround the channel 26 as shown in FIG. 1 such that the concentration of complementary dopant atoms is substantially uniform across the source 24, channel 26 and drain 25. Unfortunately, the increased concentration of complementary dopant atoms 33 in the source region 24 effectively forms a diode junction with adjacent regions of the substrate 23. Consequently, the blanket implant process of the prior art produces a relatively large junction leakage current that flows from the source 24 directly into the surrounding substrate 23. Thus, the reduction in the subthreshold leakage current is gained at the expense of the increase in the junction leakage current which is undesirable since it contributes to the discharging of the capacitor 21.

From the foregoing, therefore, it will be appreciated that there is a need for a memory array having reduced discharge rates and methods for providing the same. In particular, to provide reduced subthreshold leakage currents, there is a need for the channel regions of the substrate corresponding to the array of memory cells to include complementary dopant atoms disposed so as to increase the threshold gate voltage. Furthermore, to reduce junction leakage currents, there is a need for the complementary dopant atoms to be substantially absent from actively doped regions of the substrate that are coupled to the charge storing capacitors. Finally, there is a need for the complementary dopant atoms to be disposed in such a way that the channel regions of the memory arrays becomes conductive at substantially uniform threshold voltages.

SUMMARY OF THE INVENTION

The aforementioned needs are satisfied by the memory array and method of manufacturing the same of the present invention. In one aspect, the present invention comprises a memory array of a DRAM device that comprises a plurality of memory cells for storing information, wherein the memory cells are arranged into a plurality of cell pairs such that each pair includes first and second cells each comprising a storage element for storing charge and a valve element for controlling the flow of charge to and from the corresponding storage element. The valve elements of each cell pair are disposed adjacent each other and the charge storage element of the cell pair are outwardly disposed form the valve element of the cell pair. The array further comprises a substrate comprising a plurality of valve regions and a plurality of storage regions wherein the first and second valve elements of each cell pair overlap a corresponding valve region of the plurality of valve regions. The first and second storage elements of each cell pair are electrically coupled to respective first and second storage regions of the plurality of storage regions and the valve regions of the substrate include a first concentration of complementary dopant atoms. The storage regions of the substrate include a reduced second concentration of complementary dopant atoms, thereby reducing the rate at which charge escapes from the charge storage element during quiescent periods.

In another aspect, the present invention comprises a method of reducing leakage currents in a DRAM device. The method comprises selectively implanting complementary dopant atoms within a first region of the substrate and then forming a plurality of field effect transistors each comprising first and second active nodes and a channel extending therebetween. The first active node is disposed in the substrate so that a substantial portion of the first active node is disposed outside of the first region so as to reduce a junction leakage current and the channel and second active node are disposed within the first region so as to reduce subthreshold leakage current.

DETAILED DESCRIPTION OF THE PREFERRED EMBODIMENT

Figure 1:
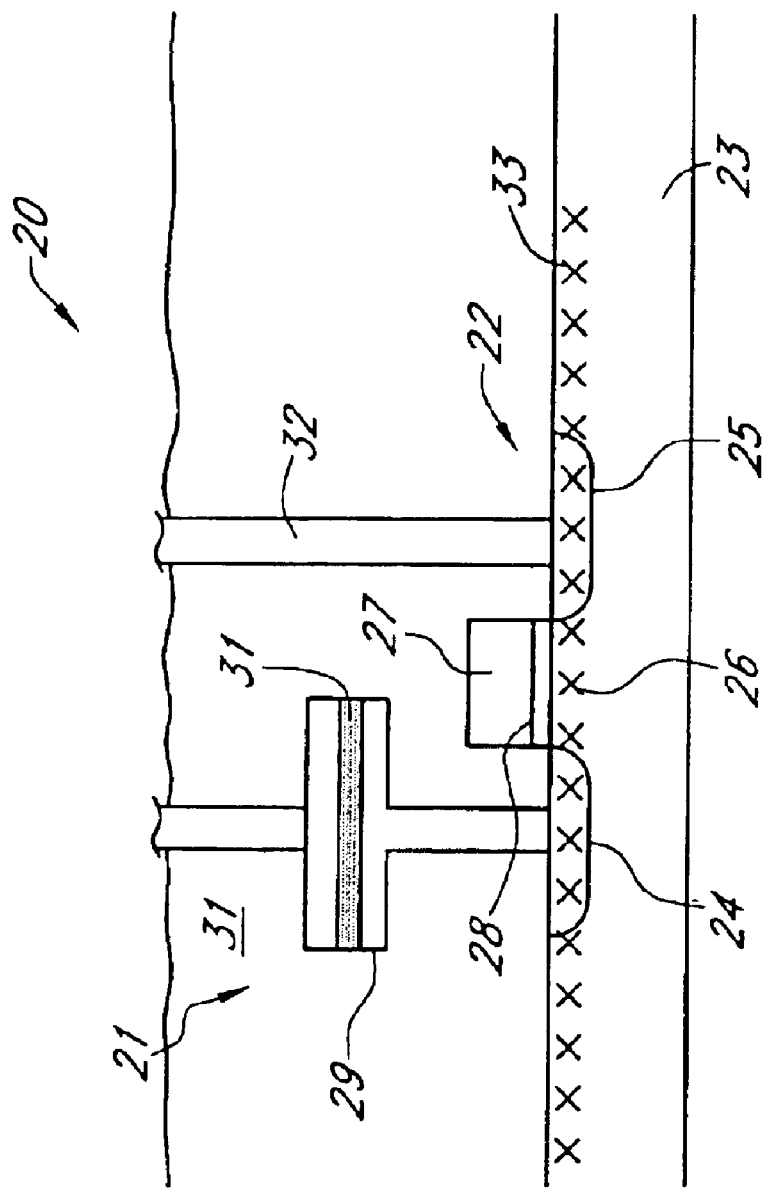
FIG. 1 is a cross-sectional view of a DRAM memory cell of the prior art.
Figure 2:
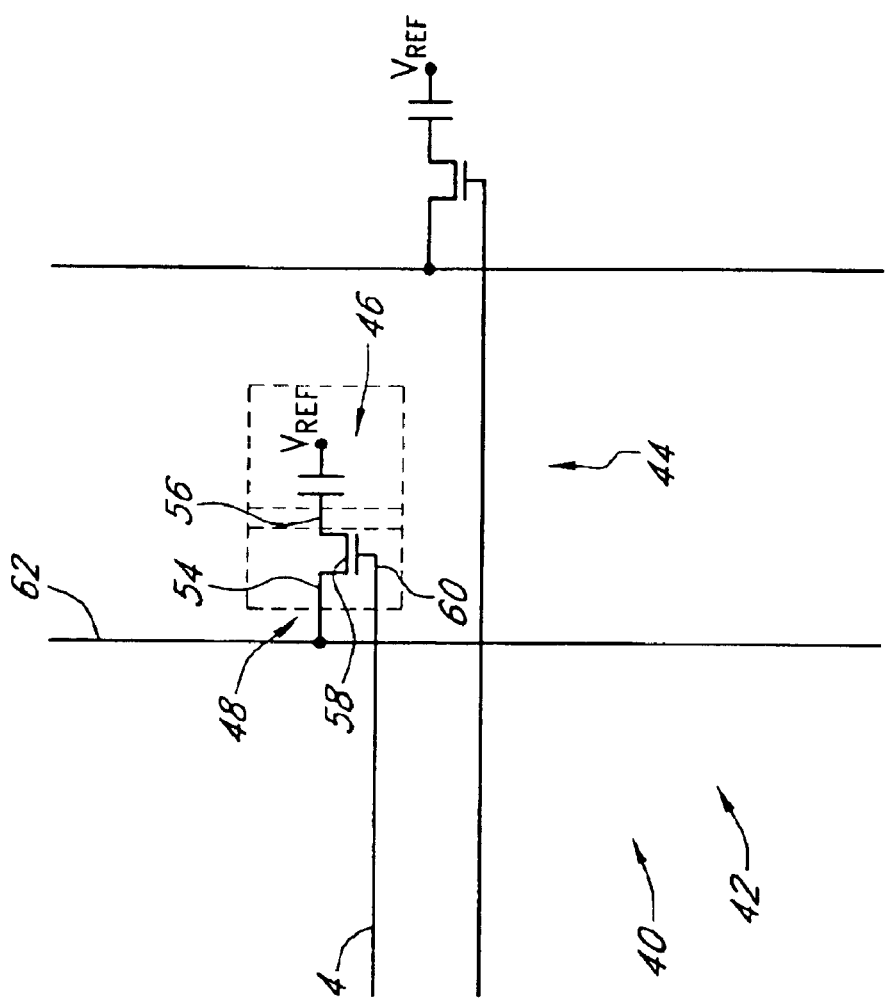
FIG. 2 is a schematic diagram of a DRAM memory array according to one aspect of the present invention.

Reference will now be made to the drawings wherein like numerals refer to like parts throughout. FIG. 2 schematically illustrates a memory array 40 of a DRAM device 42 according to one aspect of the present invention. The array comprises a plurality of memory cells 44 which are each capable of storing a unit of information, such as a binary digit, or bit. Each cell comprises a charge storage element 46 for storing a quantity of charge which is indicative of the state of the cell 44 and a current valve 48 for controlling a flow of charge to and from the storage element 46.

In the preferred embodiment, the valve 48 is a field effect transistor (FET) and the charge storage element is a capacitor having first and second plates 50, 52. The FET 48 comprises first and second inputs 54, 56, a channel 58 disposed between the first and second inputs 54, 56, and a gate electrode 60 for altering the conductivity of the channel 58. The first input 54 of each FET 48 is coupled to a corresponding digit line 62 that carries a data signal to and from the FET 48. The gate electrode 60 is coupled to a corresponding row line 64 that carries a control signal for controlling the operating mode of the FET 48. The second input 56 of the FET 48 is coupled to the first plate 50 of the corresponding capacitor 46 and the second plate 52 of the capacitor 46 is coupled to a reference voltage so as to enable a potential difference to be developed across the capacitor plates 50, 52.

Each cell 44 is addressed individually during either a write operation, such that data is stored in the cell 44, or a read operation, such that data is retrieved from the cell 44. To address the cell 44, a voltage greater than the threshold voltage of the FET 48 is applied along the corresponding row line 64 so as to configure the channel 58 of the FET 48 into a conducting path. During quiescent periods when the cell 44 is neither written to nor read from, the channel 58 is configured into a high impedance state by asserting a subthreshold voltage at the gate electrode 60 so as to inhibit charge from leaving or entering the first plate 50 of the capacitor 46.

The memory array 40 is disposed so as to overlap a semiconductor substrate 66 having a plurality of storage regions 68 and a corresponding plurality of valve regions 70. The storage elements 46 of the memory array 40 are disposed so as to substantially overlap the storage regions 68 of the substrate 66 and the valve elements 48 of the memory array 40 are disposed so as to substantially overlap the valve regions 70 of the substrate 66. As will be described in greater detail below, to enhance the ability of the storage elements 46 to store charge during the quiescent periods, complimentary dopant atoms are selectively embedded in the substrate 66 such that the concentration of dopant atoms in the valve regions 70 is larger than that of the storage regions 68.

Figure 3:
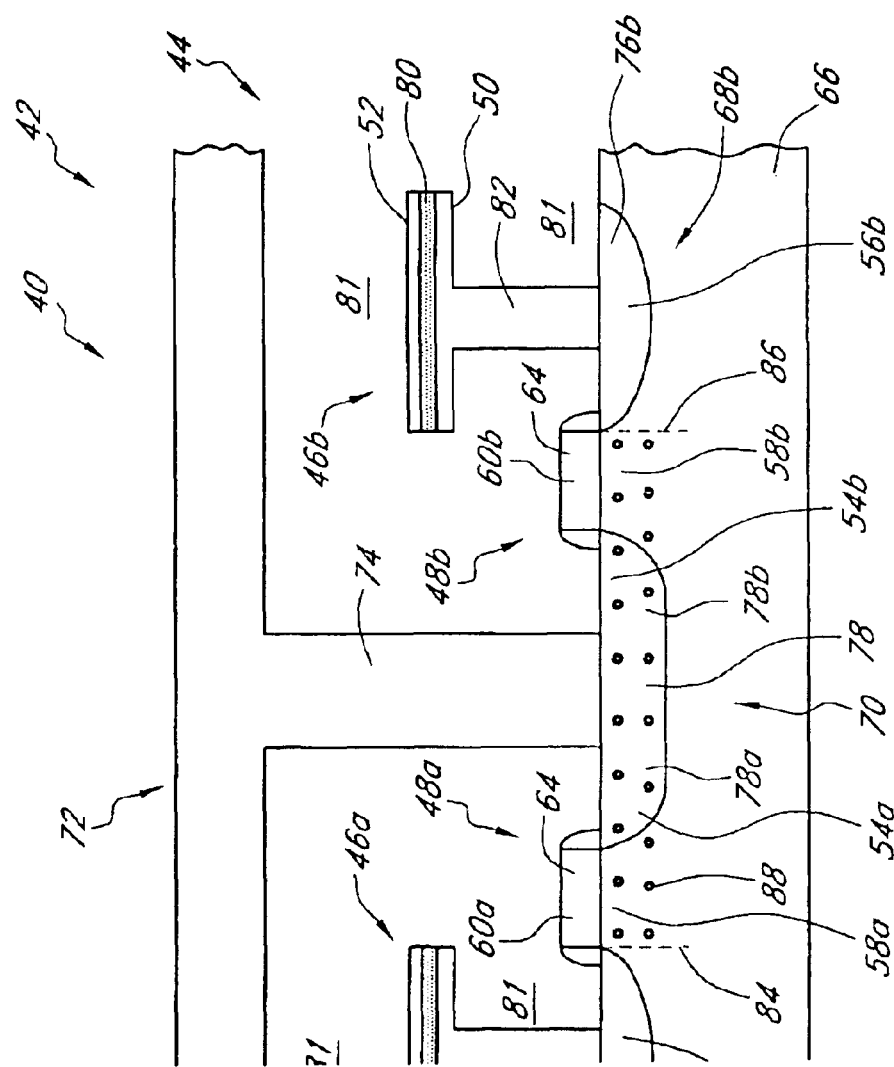
FIG. 3 is a cross-sectional view of one embodiment of the DRAM memory array of FIG. 2.
Figure 4:
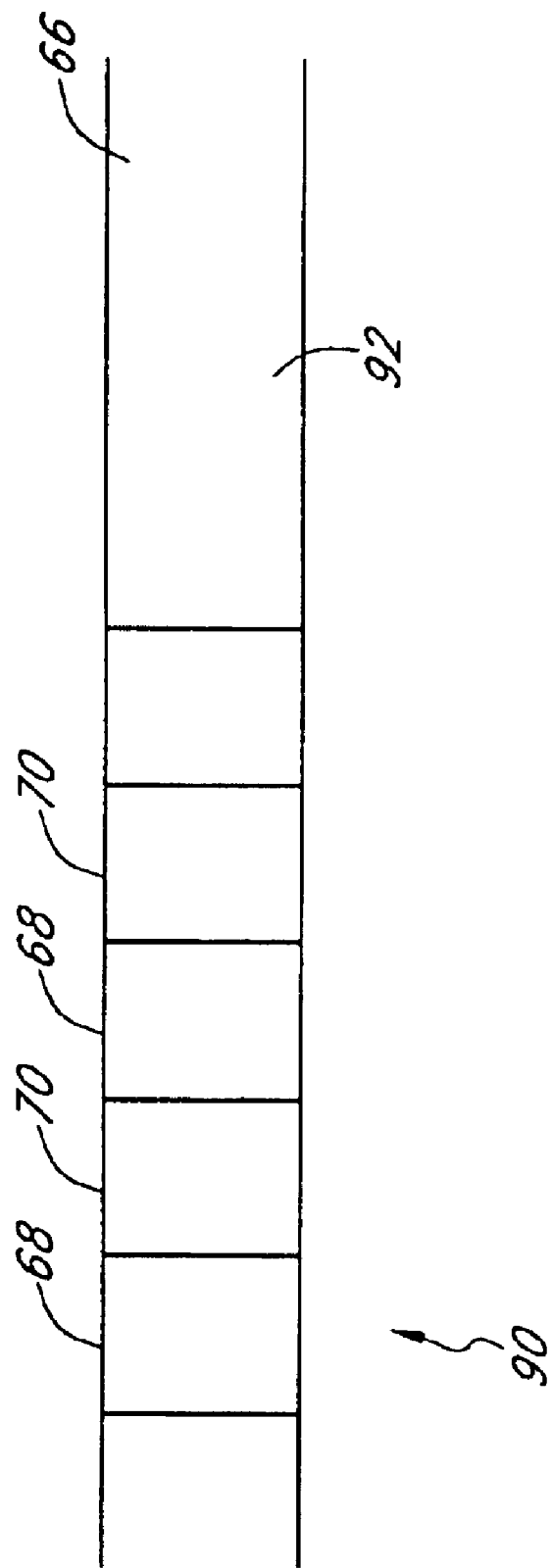
FIG. 4 is a cross-sectional view of the substrate of the DRAM of FIG. 2 and illustrates a memory array section of the substrate partitioned into a plurality of valve regions and a plurality of storage regions.

Reference will now be made to FIG. 3 which illustrates one particular embodiment of the memory array 40 of FIG. 2. The plurality of memory cells 44 of the memory array 40 are arranged into a plurality of cell pairs 72 which are disposed above and within the substrate comprising a known semiconductor material, such as silicon. Although only the first and second cells 44a, 44b of one of the cell pairs 72 are shown in FIG. 4, the array 40 preferably includes additional cell pairs configured according to the pattern of FIG. 4. Each cell pair 72 includes the first and second memory cells 44a, 44b that are coupled to a common digit line contact 74 and configured in a symmetrical manner such that the first cell 44a is disposed to one side of the digit line contact 74 and the second cell 44b is disposed to an opposing side of the digit line contact 74. The first cell 44a comprises the first FET 48a and the first capacitor 46a and the second cell comprises the second FET 48b and the second capacitor 46b.

In this application, the terms "inward" and "inwardly" are used to define positions between first and second channels 58a, 58b of the cells 44a, 44b of each cell pair 72 and the terms "outward" and "outwardly" are used to define positions that are not between the first and second channels 58a, 58b. Accordingly, the first FET 48a comprises the first channel 58a of the substrate, the first gate electrode 60a disposed above the first channel 58a, a first outwardly disposed active sub-region 76a of the substrate 66, and a first inwardly disposed active sub-region 78a of the substrate 66 such that the first channel 58a is disposed between the first inward and outward active sub-regions 78a, 76a. Likewise, the second FET 48b comprises the second channel 58b of the substrate 66, the second gate electrode 60b disposed above the second channel 58b, a second outwardly disposed active sub-region 76b of the substrate 66, and a second inwardly disposed active sub-region 78b of the substrate 66 such that the second channel 58b is disposed between the second inward and outward active sub-regions 78b, 76b. The active sub-regions 76a, 76b, 78a, 78b are doped in a well known manner and collectively form the first and second inputs 54a, 56b, 54b, 56b of the first and second FETs 48a, 48b. Preferably, the first and second inward active sub-regions 78a, 78b combine to form a common inward active sub-region 78 that extends between the first and second channels 58a, 58b and is coupled to the common digit line contact 74.

Each of the capacitors 46a, 46b is fabricated using well known techniques and comprises the first and second conducting plates 50, 52 sandwiched around an insulator 80. Each of the first capacitor plates 50 conducting contact 82 that extends to one of the outward active sub-regions 76a, 76b of the substrate 66. Each digit line 62 is constructed of metal using well known techniques so that it extends to a plurality of the digit line contacts 74 that each extends to the corresponding common inward active region 78 of the substrate 66. An insulating medium 81 is disposed between the substrate 66 and the digit line 72 so as to electrically isolate the capacitors 46a, 46b, the gate electrodes 48a, 48b, and the digit line 72 from each other.

FIG. 3 illustrates one of the plurality of valve regions 70 of the substrate 66. The valve region 70 is disposed between opposing first and second storage regions 68a, 68b of the plurality of storage regions 68 of the substrate 66. The valve region 70 extends from an outward edge 84 of the first channel 58a of the substrate 66 to an outward edge 86 of the second channel 58b of the substrate 66. Thus, the valve region 70 comprises the first and second channel 58a, 58b regions and the common inward active region 78 disposed therebetween. Furthermore, the first and second storage regions 76a, 76b extend away from the valve region 70 so as to respectively encompass substantial portions of the first and second outward active sub-regions 76a, 76b of the substrate 66.

As mentioned above, to enhance the charge storing capabilities of the storage elements 46 of the memory array 40, complementary dopant atoms are selectively doped within the substrate 66 such that the dopant atoms are predominantly disposed in the valve regions 70 of the substrate and such that the dopant atoms are substantially absent from the storage regions 68. The complementary dopant atoms, for N-channel devices are preferably trivalent dopant atoms such as Boron, $BF_2$, Indium etc. For P-channel devices, the dopant atoms are preferably pentavalent dopant atoms, such as phosphorous, arsenic, antimony etc.

For example, FIG. 3 illustrates the valve region 70 having the complementary doping atoms 88 disposed therein. Because the channels 58a, 58b are located in the valve region 70, the presence of complementary doping atoms 88 within the valve region 70 increases the threshold voltage of the FETs 48a, 48b and, therefore, reduces the likelihood that charge will travel across the channels 48a, 48b during quiescent periods. Furthermore, by reducing the concentration of complementary dopant atoms within the outward active sub-regions 76a, 76b, the rate at which charge flows between the outward sub-regions 76a, 76b and neighboring portions of the substrate 66 is also reduced. Thus, the benefit of reduced sub-threshold leakage currents, $I_S$, flowing through the channels 58a, 58b is realized without substantially increasing the junction currents, $I_J$, flowing directly into the substrate 66. Consequently, the memory array 40 of FIG. 3 is able to substantially overcome the problems of the prior art which suffers from increased junction leakage currents caused by non-selectively implanting complementary dopant atoms throughout an array section of a substrate.

Reference will now be made to FIGS. 4 through 8 which illustrate methods of selectively implanting complementary dopant atoms according to one aspect of the present invention. As shown in FIG. 4, the substrate of the DRAM 42 is partitioned to define a memory array section 90 and periphery sections 92. The array section 90 of the substrate 66 overlaps the memory array 40 of FIG. 3 and the periphery sections 92 overlap peripheral circuitry, i.e., circuitry other than that of the memory array 40. The memory array section is further partitioned into the previously mentioned pluralities of storage regions 68 and valve regions 70.

Figure 5:
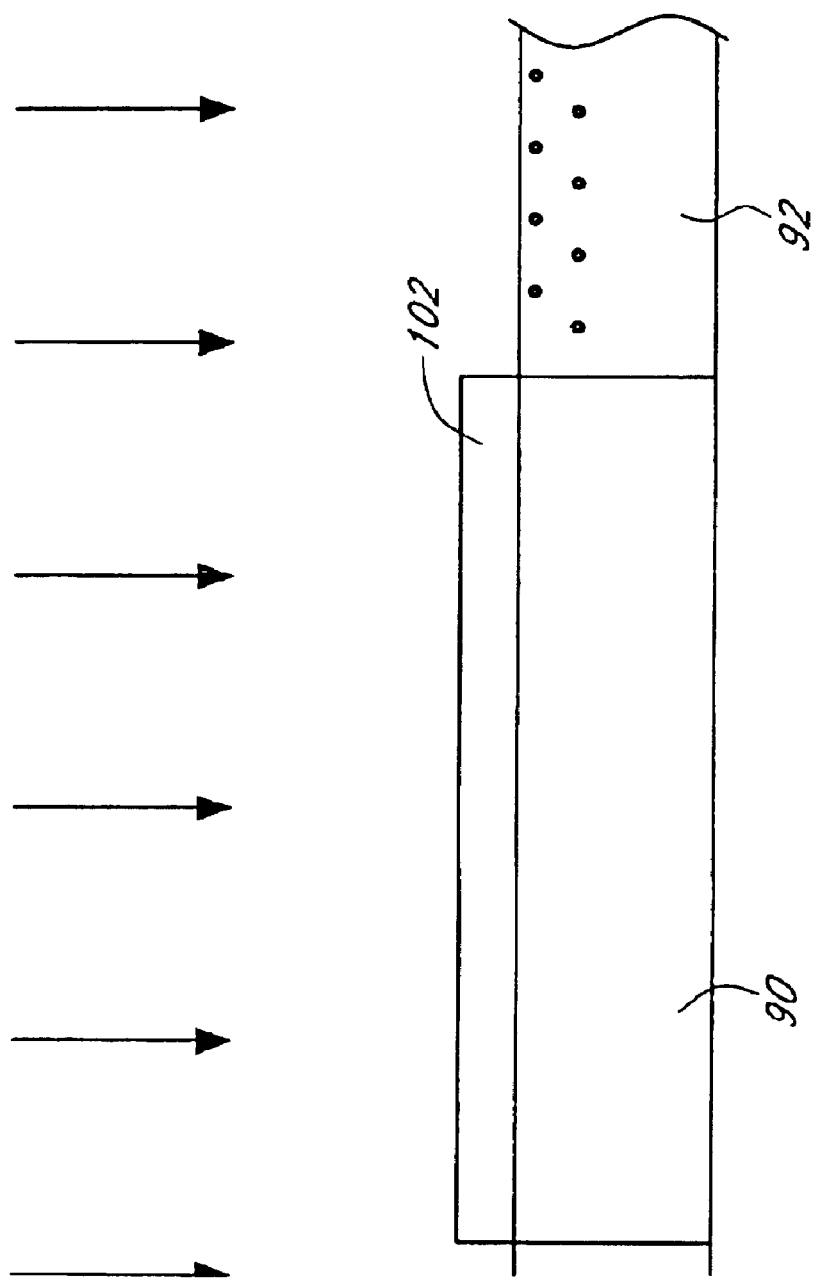
FIG. 5 is a cross-sectional view of the substrate of the DRAM of FIG. 2 and illustrates a first enhancement implant process which embeds complementary dopant atoms within a periphery section of the substrate.

In one embodiment, a pre-enhancement implant process is performed which embeds complementary dopant atoms 100 only in the periphery sections 92 so as to raise the threshold voltages of FETs of the peripheral circuitry. As shown in FIG. 5, using well known techniques, a mask 102 is first deposited above the substrate 66 and then patterned to expose the periphery sections 92 of the substrate 66 and cover the array section 90. The substrate 66 is then exposed to an energetic source of the complementary dopant atoms 104 so as to embed the complementary dopant atoms 100 substantially only within the peripheral sections 92 and the mask layer 102 is removed to expose the entire substrate 66 (not shown). Because the mask layer 100 covers the memory array section 90 of the substrate 66, the complementary dopant atoms 100 are substantially inhibited from becoming embedded within the memory array section 90. Thus, the first enhancement implant process of FIG. 5 does not substantially alter the memory array section 90 of the substrate 66.

Figure 6:
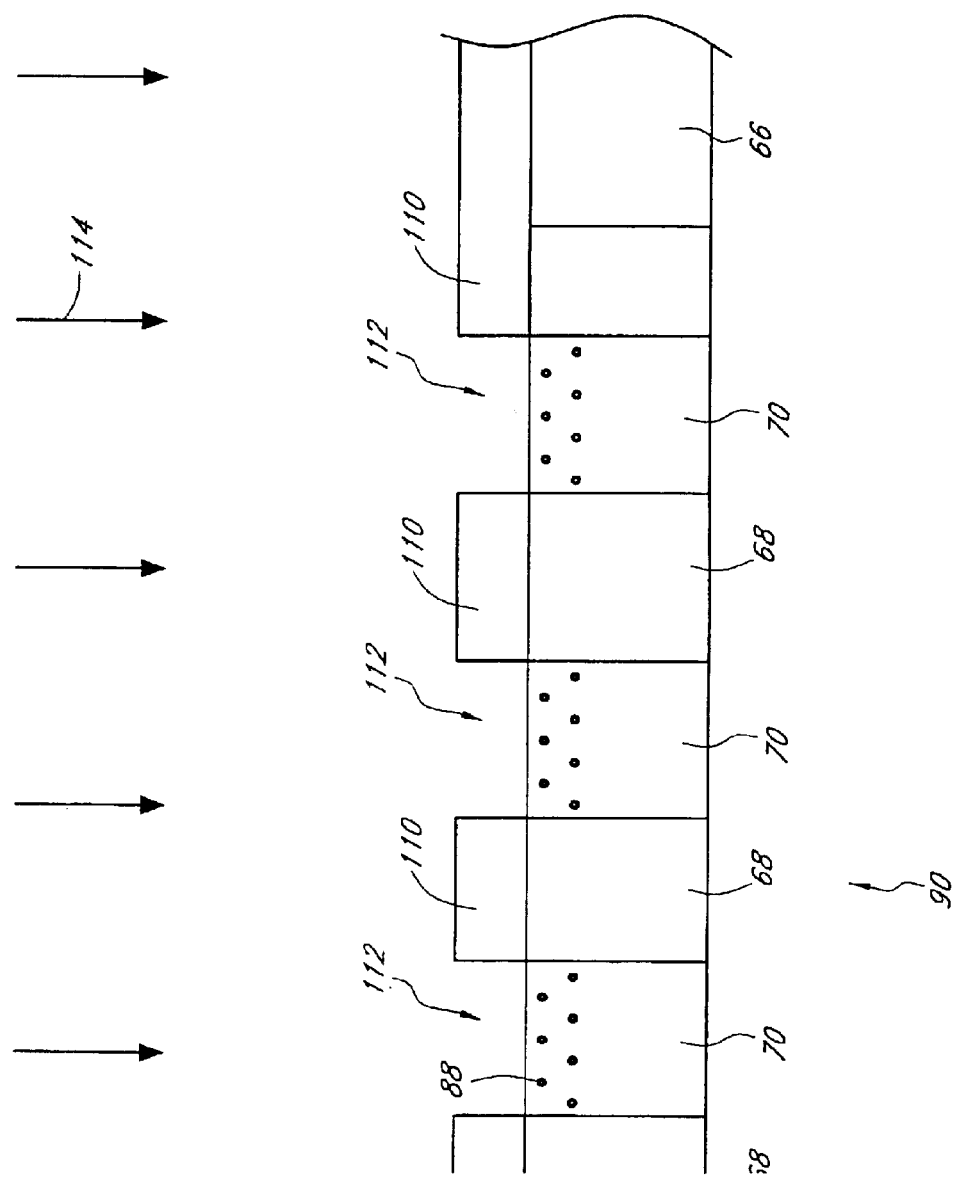
FIG. 6 is a cross-sectional view of the substrate of the DRAM of FIG. 2 and illustrates a second enhancement implant process which embeds complementary dopant atoms within the valve regions of the substrate.

As shown in FIG. 6, an enhancement implant is performed which is intended to raise the threshold voltages of the FETs of the memory array 40 without substantially affecting the peripheral circuitry. A mask layer 110 is deposited above the substrate 66 so as to cover the periphery and array sections 92, 90 of the substrate 66. The mask layer 110 is then patterned to define a plurality of openings 112 that extend to the valve regions 70 of the array section 90 of the substrate 66. Thus, in addition to covering the periphery sections 92 of the substrate 66, the remaining portion of the mask layer 110 substantially covers the storage regions 68 of the substrate 66. However, the openings 112 formed in the mask layer 110 substantially expose the valve regions 70 of the substrate 66.

As shown in FIG. 6, the substrate 66 is then exposed to a source of energetic complementary dopant atoms 114. Because the openings 112 expose the valve regions 70 and the mask layer 110 substantially covers the storage regions 68, most of the embedded complementary dopant atoms 88 are disposed within the valve regions 70 of the substrate 66.

Figure 7:
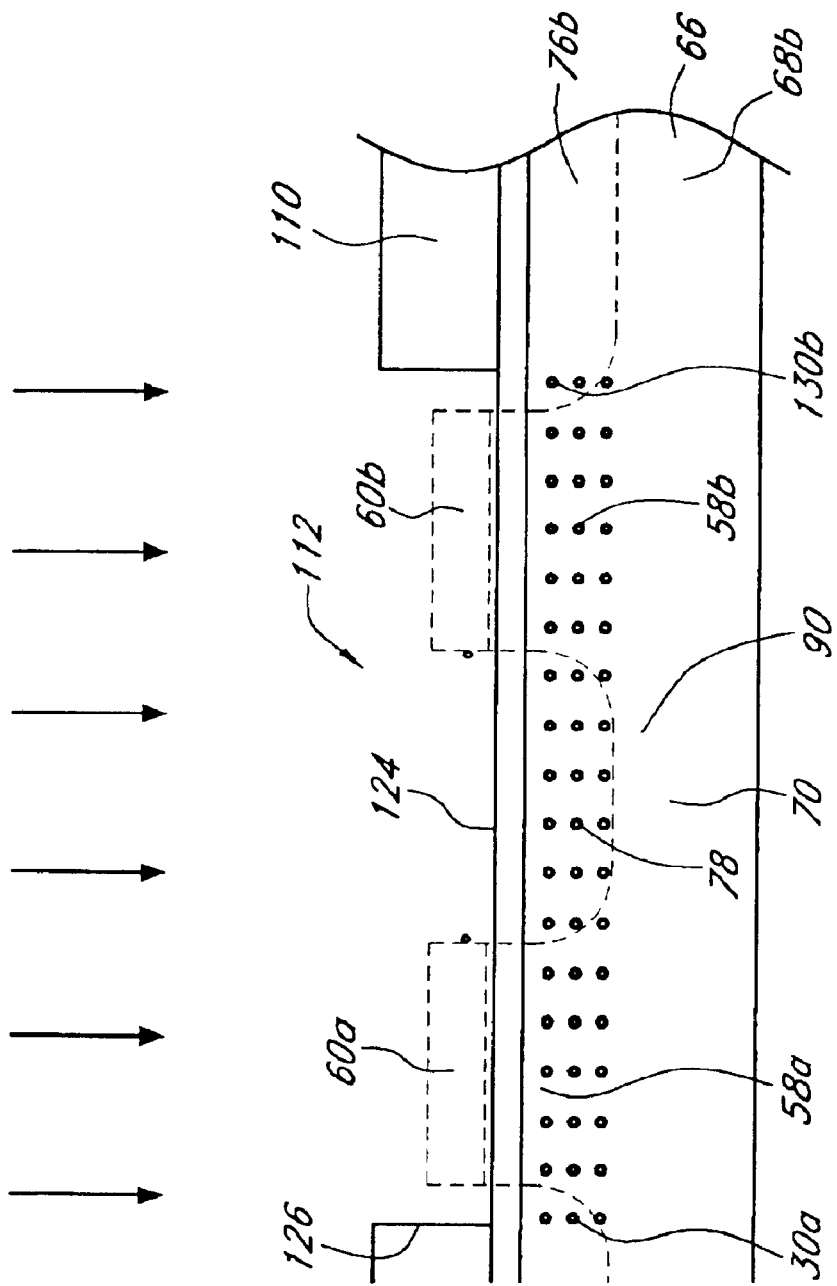
FIG. 7 is a cross-sectional view of the substrate of the DRAM of FIG. 2 and illustrates one embodiment of the second enhancement implant process of FIG. 6 in greater detail.
Figure 8:
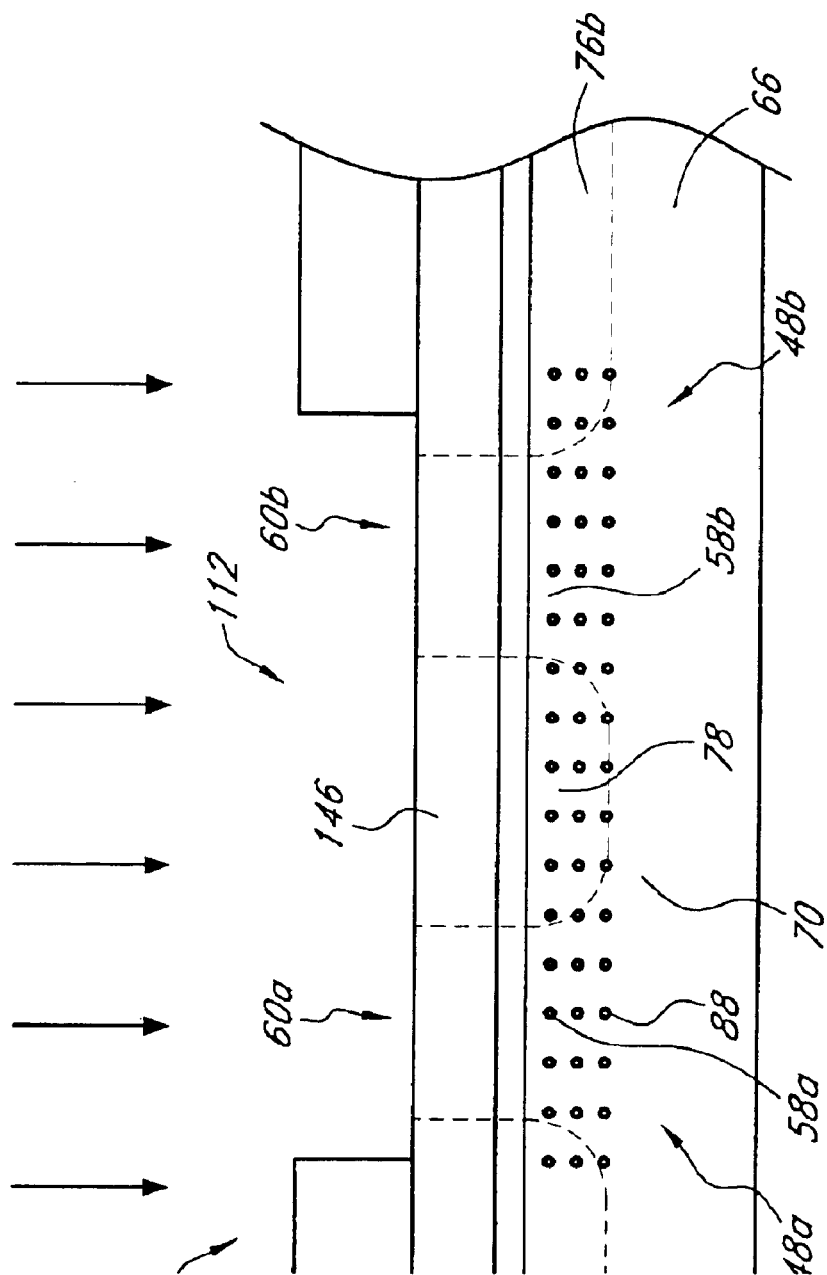
FIG. 8 is a cross-sectional view of the substrate of the DRAM of FIG. 2 and illustrates another embodiment of the second enhancement implant process of FIG. 6 in greater detail.

FIGS. 7 and 8 illustrate preferred embodiments of the enhancement implant process of FIG. 6 in greater detail and are intended to correspond to the memory array 40 of FIG. 3. More particularly, one of the plurality of openings 112 is shown extending to one of the valve regions 70 of the array section 90 of the substrate 66. Also indicated are the eventual locations of the outward active sub-regions 76a, 76b, the channels 58a, 58b, the gate electrodes 60a, 60b, and the common inward active sub-region 78.

In the embodiment of FIG. 7, a known temporary sacrificial oxide layer 120 is deposited on a surface 122 of the substrate 66. The oxide layer 120 is performed in an early processing step so as to control subsequent oxidation of the substrate 66. The oxide layer 120 is removed in a subsequent processing step so as to allow further development of the DRAM device. However, before removing the oxide layer 120, the mask layer 110 is deposited over the oxide layer 120 and patterned to define the openings 112 which extend to regions 124 of the oxide layer 120 that overlap the valve regions 70 of the substrate 66. Energetic complementary dopant atoms 114 are then directed toward both the mask layer 110 and the exposed regions 124 of the oxide layer 120. The dopant atoms 114 impinging on the patterned mask layer 110 are substantially inhibited from penetrating into the storage regions 68 of the substrate 66 while the dopant atoms 114 impinging on the exposed regions 124 of the oxide layer 120 are able to penetrate into the substrate 66. Because the mask layer 110 covers substantial portions of the storage regions 68 of the substrate 66, the dopant atoms 88 are disposed mainly within the valve regions 70 of the substrate 66.

In a preferred embodiment, the openings 112 in the mask layer 110 are formed so that they nominally extend slightly beyond the valve regions 70 of the substrate 66. As shown in FIG. 7, assuming that the mask layer 110 is perfectly aligned with the substrate 66, a first edge of each opening 112 is disposed above the first outward active region 68a such that the first edge 126 is outwardly displaced by a relatively small first distance, d1, from the first channel 58a. Likewise, an opposing second edge 128 of each opening 112 is disposed above the second outward active region 68b such that the second edge 128 is outwardly displaced by a relatively small distance, d2, from the second channel 58b. The distances d1 and d2 are small compared to the width of the first and second outward active regions 76a, 76b. Thus, the openings 112 expose relatively small portions 130a, 130b of the outward active regions 76a, 76b.

By outwardly extending the openings 112 slightly beyond the channels 58a, 58b, the FETs of the memory array 40 can be configured to have more precisely determined threshold voltage values. In particular, imperfections in known patterning processes sometimes cause the openings of a mask to be slightly misaligned with respect to their intended locations, thereby resulting in a mask misalignment error. For example, the misalignment error can be caused by the step error of a stepper motor which is used to align a photomask over the mask layer prior to etching the mask layer. Although such errors can be reduced to less than 0.03 micron, if the mask layer 110 of FIG. 7 encroaches over either of the channels 58a, 58b by such an amount, the threshold voltage of the encroached FETs will likely be adversely affected. More particularly, the preferred adjustment to the threshold voltages requires the complementary doping atoms 88 to be embedded across the entire width of each of the channels 58a, 58b. Thus, to accommodate such misalignment errors, the openings of the mask layer 112 are enlarged so that the nominal distances d1 and d2 match or exceed the largest expected misalignment error. Consequently, if the misalignment error is at the maximum value, the complementary dopant atoms will still be disposed across the entire widths of the channels 58a, 58b.

Although the outward portions 130a, 130b of the outward active sub-regions 76a, 76b of the substrate 66 are nominally exposed to the complementary dopant atoms 114, it will be appreciated that the increased presence of the complementary dopant atoms therein does not substantially increase the junction leakage currents of the memory array 40. In particular, because the distances d1 and d2 are substantially less than the widths of the outward active sub-regions 76a, 76b, most of the outward active sub-regions 76a, 76b have a relatively small concentration of the complementary dopant atoms. For example, in one embodiment, the nominal distances d1 and d2 are approximately equal to 0.03 while the width of each outward active sub-regions is approximately equal to 0.15 micron.

In the embodiment of FIG. 8, the complementary dopant atoms 88 are embedded substantially within the valve regions 70 of the substrate 66 in a manner that reduces thermally induced diffusion of the dopant atoms 88. In particular, after removing a sacrificial oxide layer, an insulating gate oxide layer 140 is formed on a surface 142 of the substrate 66 and a conducting gate layer 144 is deposited over the gate oxide layer 142. These "gate layers" will subsequently be patterned to form the gate electrodes 60a, 60b of the FETs 48a, 48b. However, prior to patterning the gate layers 140, 144, the mask layer 110 is deposited above the conducting gate layer 144 and then patterned to form the openings 112 in the manner described above in connection with FIG. 7 so as to expose portions 146 of the gate layer 144 that overlie the valve regions 70 of the substrate 66. The energetic complementary dopant atoms 114 are then directed toward the openings 112 so that some of the dopant atoms 114 penetrate the gate layers 140, 144 and become embedded dopant atoms 88. Because the complementary dopant atoms are embedded after the gate layers 140, 144 are formed, the embedded atoms 88 experience less diffusion due to the fact that they are not exposed to the increased temperatures used during the formations of the gate layers.

In one embodiment, the widths of the channel regions 58 of the memory array 40 are such that it would be difficult to reliably form openings through the mask layer 110 that exposed only the channel regions. However, because the valve regions of the substrate extend substantially beyond a single channel region, the openings 112 extending through the mask layer 110 to the valve regions 70 are able to have substantially larger widths which are within the resolution of known photolithography techniques. For example, in one embodiment, the channel regions of the substrate have a width of only 0.15 microns, while the valve regions have widths approximately equal to 0.5 microns.

It will be appreciated that the memory array and methods for providing the same described above provide many advantages. In particular, because the complementary dopant atoms are embedded mainly in the valve regions of the substrate, reduced subthreshold leakage currents are realized without substantially increasing the junction leakage currents. In contrast, because the prior art consists of uniformly embedding complementary dopant atoms throughout the substrate, reduced subthreshold leakage currents are usually accompanied by substantially increased junction leakage currents.

Thus, the capacitors of the memory array are able to store a detectable amount of charge for longer periods of time, thereby reducing the overhead of charge refresh. Moreover, because the valve regions extend substantially beyond a single channel, known patterning and etching techniques can be used to reliably form the openings in the mask layer. Furthermore, by slightly expanding the openings of the mask layer so that they nominally extend into small portions of the storage regions of the substrate, the FETs of the memory array are still provided with a desired threshold voltage even if the misalignment error of the mask layer is at a maximum expected value.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. A method of reducing leakage currents in a DRAM device, the method comprising:
   selectively implanting complementary dopant atoms within a first region of the substrate, wherein the concentration of dopant atoms in the first region of the substrate is greater than the concentration of dopant atoms outside of the first region of the substrate; and
   forming a plurality of field effect transistors each comprising first and second active nodes and a channel extending therebetween, wherein the field effect transistors are formed so as to overlie the first region of the substrate, and wherein the first active node is disposed in the substrate so that a substantial portion of the first active node is disposed outside of the first region of the substrate so as to reduce a junction leakage current, and wherein the channel and second active node are disposed within the first region of the substrate so as to reduce a subthreshold leakage current.

2. The method of claim 1, wherein selectively implanting complementary dopant atoms comprises selectively implanting trivalent atoms.

3. The method of claim 2, wherein the complementary dopant atoms are selected from the group consisting of Boron, $BF_2$ and indium.

4. The method of claim 1, wherein the complementary dopant atoms comprise pentavalent atoms.

5. The method of claim 4, wherein the complementary dopant atoms are selected from the group consisting of phosphorous, arsenic and antimony.

6. The method of claim 1, wherein selectively implanting complementary dopant atoms comprises:
   depositing a first layer over a first surface of the substrate;
   patterning the first layer so as to define a plurality of apertures that extend through the first layer, wherein each aperture exposes respective first and second channel domains of the substrate and a central domain of the substrate extending between the first and second channel domains, wherein the first layer shields a plurality of storage domains of the substrate;
   exposing the first layer to a source of complementary dopant atoms so that a substantial portion of the dopant atoms are embedded into the pluralities of first and second channel domains and the plurality of central domains, and wherein the first layer inhibits dopant atoms from embedding within the plurality of storage domains of the substrate; and
   removing the first layer.

7. The method of claim 6, wherein forming a plurality of field effect transistors comprises forming a plurality of adjacent pairs of field effect transistors that share a common second active node.

8. The method of claim 7, wherein forming a plurality of field effect transistors further comprises:
   forming a first and second gate electrodes over the first and second channel domains;
   doping the central domain so as to form the common second active node, wherein the central domain is doped with a first type of dopant atoms that provide electrical conduction of a type which is opposite to that provided by the complementary dopant atoms; and
   doping first and second storage domains of the substrate so as to form first active nodes of the pair of field effect transistors.

9. A method of reducing leakage currents in a DRAM device, the method comprising:
   forming a valve region between first and second storage regions in a substrate, wherein complementary dopant atoms are selectively implanted within the valve region of the substrate, and wherein the concentration of dopant atoms in the valve region of the substrate is greater than the concentration of dopant atoms in the first and second storage regions of the substrate; and
   forming a plurality of transistors on the substrate so as to overlie the valve region, wherein each transistor comprises first and second active nodes and a channel extending therebetween, and wherein the first active node of each transistor is disposed in the substrate so that a substantial portion of the first active node is disposed in at least one of the storage regions of the substrate so as to reduce a junction leakage current, and wherein the channel and second active node of each transistor are disposed within the valve region of the substrate so as to reduce a subthreshold leakage current.

10. The method of claim 9, wherein selectively implanting complementary dopant atoms comprises selectively implanting trivalent atoms.

11. The method of claim 10, wherein the complementary dopant atoms are selected from the group consisting of Boron, $BF_2$ and indium.

12. The method of claim 9, wherein the complementary dopant atoms comprise pentavalent atoms.

13. The method of claim 12, wherein the complementary dopant atoms are selected from the group consisting of phosphorous, arsenic and antimony.

14. The method of claim 9, wherein selectively implanting complementary dopant atoms comprises:

depositing a first layer over a first surface of the substrate;

patterning the first layer so as to define a plurality of apertures that extend through the first layer, wherein each aperture exposes respective first and second channel domains of the substrate and a central domain of the substrate extending between the first and second channel domains, wherein the first layer shields a plurality of storage domains of the substrate;

exposing the first layer to a source of complementary dopant atoms so that a substantial portion of the dopant atoms are embedded into the pluralities of first and second channel domains and the plurality of central domains, and wherein the first layer inhibits dopant atoms from embedding within the plurality of storage domains of the substrate; and removing the first layer.

15. The method of claim 14, wherein forming a plurality of transistors comprises forming a plurality of adjacent pairs of field effect transistors that share a common second active node.

16. The method of claim 15, wherein forming a plurality of field effect transistors further comprises:

forming first and second gate electrodes over the first and second channel domains;

doping the central domain so as to form the common second active node, wherein the central domain is doped with a first type of dopant atoms that provide electrical conduction of a type which is opposite to that provided by the complementary dopant atoms; and doping first and second storage domains of the substrate so as to form first active nodes of the pair of field effect transistors.

17. A method of reducing leakage currents in a DRAM device, the method comprising:

selectively implanting complementary dopant atoms in a substrate so as to define a first concentration of complementary dopant atoms in at least one valve region of the substrate and a reduced second concentration of complementary dopant atoms in a plurality of storage regions of the substrate, wherein the concentration of dopant atoms in the at least one valve region of the substrate is greater than the concentration of dopant atoms in the plurality of storage regions of the substrate; and forming a plurality of transistors on the substrate so as to overlie the at least one valve region of the substrate, and wherein each transistor comprises first and second active nodes and a channel extending therebetween, and wherein the first active node of each transistor is disposed in the substrate so that a substantial portion of the first active node is disposed in the storage regions of the substrate to thereby reduce junction leakage current, and wherein the channel and second active node of each transistor are disposed within the valve region of the substrate so as to reduce subthreshold leakage current.

* * * * *